United States Patent
Fernandez et al.

(10) Patent No.: US 9,970,996 B2
(45) Date of Patent: May 15, 2018

(54) METHODS AND APPARATUS FOR GENERATING A THRESHOLD SIGNAL IN A MAGNETIC FIELD SENSOR

(71) Applicant: ALLEGRO MICROSYSTEMS, LLC, Worcester, MA (US)

(72) Inventors: Devon Fernandez, Londonderry, NH (US); Mathew Drouin, Hooksett, NH (US)

(73) Assignee: ALLEGRO MICROSYSTEMS, LLC, Manchester, NH (US)

( * ) Notice: Subject to any disclaimer, the term of this patent is extended or adjusted under 35 U.S.C. 154(b) by 36 days.

(21) Appl. No.: 14/600,826

(22) Filed: Jan. 20, 2015

(65) Prior Publication Data

US 2016/0208763 A1    Jul. 21, 2016

(51) Int. Cl.
*G01P 3/00* (2006.01)
*G01R 33/09* (2006.01)
(Continued)

(52) U.S. Cl.
CPC .............. *G01R 33/09* (2013.01); *F02P 7/067* (2013.01); *G01P 3/487* (2013.01); *G01P 13/00* (2013.01);
(Continued)

(58) Field of Classification Search
CPC ......... F02P 5/045; G01R 33/07; G01R 33/09; G01P 13/00; G01P 3/44; G01D 5/2448
(Continued)

(56) References Cited

U.S. PATENT DOCUMENTS 3,697,870 A    10/1972    Brenner
4,405,896 A    9/1983    Akita
(Continued)

FOREIGN PATENT DOCUMENTS

CN    102 388 316    3/2012
EP    2 391 903    12/2012
(Continued)

OTHER PUBLICATIONS

Datasheet, Allegro Microsystems, Inc., "ATS637LSA, True Power On, Self-Calibrating, Zero Speed Gear Tooth Sensor System," Aug. 2001, 13 pages.
(Continued)

*Primary Examiner* — Julian Huffman
*Assistant Examiner* — Michael Konczal
(74) *Attorney, Agent, or Firm* — Daly, Crowley, Mofford & Durkee, LLP

(57) ABSTRACT

A magnetic field sensor for detecting motion of an object includes threshold generation circuitry and processing. Magnetic field sensing elements are configured to generate a magnetic field signal in response to a magnetic field associated with the object. A motion detector responsive to the magnetic field signal and to a threshold signal is configured to generate a detector output signal having edges occurring in response to a comparison of the magnetic field signal and the threshold signal. A speed detector responsive to the detector output signal generates a speed signal indicative of a speed of motion of the object. A threshold generator responsive to the speed signal generates the threshold signal having a level that varies in response to the speed signal.

31 Claims, 5 Drawing Sheets

(51) Int. Cl.
| | |
|---|---|
| G01P 13/00 | (2006.01) |
| G01R 33/07 | (2006.01) |
| G01P 3/487 | (2006.01) |
| G01R 33/00 | (2006.01) |
| G01P 13/04 | (2006.01) |
| F02P 7/067 | (2006.01) |

(52) U.S. Cl.
CPC ........ *G01P 13/045* (2013.01); *G01R 33/0029* (2013.01); *G01R 33/07* (2013.01)

(58) Field of Classification Search
USPC .................................................. 324/160–180
See application file for complete search history.

(56) References Cited

U.S. PATENT DOCUMENTS

| | | | |
|---|---|---|---|
| 5,339,067 A | 8/1994 | Harris et al. | |
| 5,442,283 A | 8/1995 | Vig et al. | |
| 5,497,084 A * | 3/1996 | Bicking | G01D 5/2448 324/166 |
| 5,554,948 A * | 9/1996 | Hansen | H03K 5/086 324/166 |
| 5,650,719 A | 7/1997 | Moody et al. | |
| 5,670,886 A | 9/1997 | Wolff et al. | |
| 5,729,130 A | 3/1998 | Moody et al. | |
| 5,917,320 A | 6/1999 | Scheller et al. | |
| 6,091,239 A | 7/2000 | Vig et al. | |
| 6,100,680 A | 8/2000 | Vig et al. | |
| 6,242,908 B1 | 6/2001 | Scheller et al. | |
| 6,289,072 B1 | 9/2001 | Hubbard et al. | |
| 6,356,741 B1 | 3/2002 | Bilotti et al. | |
| 6,404,188 B1 | 6/2002 | Ricks | |
| 6,525,531 B2 | 2/2003 | Forrest et al. | |
| 6,693,419 B2 | 2/2004 | Stauth et al. | |
| 6,853,178 B2 | 2/2005 | Hayat-Dawoodi | |
| 6,919,720 B2 | 7/2005 | Vig et al. | |
| 7,199,579 B2 | 4/2007 | Scheller et al. | |
| 7,362,094 B2 | 4/2008 | Voisine et al. | |
| 8,058,864 B2 | 11/2011 | Scheller et al. | |
| 8,089,270 B2 | 1/2012 | Scheller et al. | |
| 2003/0231013 A1 * | 12/2003 | Faymon | G01P 3/488 324/166 |
| 2006/0119348 A1 * | 6/2006 | Blossfeld | F02D 41/009 324/166 |
| 2009/0001972 A1 | 1/2009 | Fernandez et al. | |
| 2012/0249126 A1 * | 10/2012 | Friedrich | G01D 5/2448 324/207.13 |

FOREIGN PATENT DOCUMENTS

| | | |
|---|---|---|
| JP | 2005 517 187 | 6/2005 |
| JP | 2007 132 706 | 5/2007 |
| JP | 2012 520 460 | 9/2012 |
| WO | WO 03/067269 | 8/2003 |
| WO | WO 03067269 A2 * | 8/2003 ............. G01D 5/145 |

OTHER PUBLICATIONS

Datasheet, Allegro Microsystems, Inc., "ATS633LSB True Power On, Self-Calibrating, Zero Speed Gear Tooth Sensor System," 2001, 2003, 15 pages.
Preliminary Amendment dated Apr. 12, 2010 for U.S. Appl. No. 12/401,096; 7 pages.
Notice of Allowance dated Oct. 6, 2011 for U.S. Appl. No. 12/401,096; 18 pages.
Search Report and Written Opinion dated Mar. 26, 2010 for PCT Application No. PCT/US2010/020602, 13 pages.
International Preliminary Report on Patentability dated Sep. 22, 2011 for PCT Application No. PCT/US2010/020602, 8 pages.
Scheller et al., "Circuits and Methods for Providing a Magnetic Field Sensor with an Adaptable Threshold", filed on Apr. 17, 2009 for U.S. Appl. No. 12/425,528; 43 pages.
Office Action dated Jan. 3, 2011 for U.S. Appl. No. 12/425,528; 14 pages.
Response to Office Action dated Apr. 1, 2011 for U.S. Appl. No. 12/425,528; 14 pages.
Final Office Action dated May 5, 2011 for U.S. Appl. No. 12/425,528; 14 pages.
Response to Final Office Action dated Jul. 5, 2011 for U.S. Appl. No. 12/425,528; 15 pages.
Notice of Allowance dated Sep. 14, 2011 for U.S. Appl. No. 12/425,528; 9 pages.
National Semiconductor, ADC0852/ADC0854 Multiplexed Comparator with 8-bit Reference Divider; Apr. 1995; 20 Pages.
Chinese Office Action with English translation dated Jun. 28, 2013 for Chinese Application No. 201080011537.8; 17 pages.
Instruction Letter for responding to Chinese Office Action dated Jun. 28, 2013 for Chinese Application No. 201080011537.8; 7 pages.
Response to Chinese Office Action dated Nov. 8, 2013 for Chinese Application No. 201080011537.8; 10 pages.
Chinese Office Action with English translation dated Jan. 28, 2014 for Chinese Application No. 201080011537.8; 6 pages.
Comments to Office Action dated Jan. 28, 2014 for Chinese Application No. 201080011537.8; 1 page.
Instruction Letter for responding to Chinese Office Action dated Jan. 28, 2014 for Chinese Application No. 201080011537.8; 1 pages.
Response to Chinese Office Action dated Feb. 13, 2014 for Chinese Application No. 201080011537.8; 8 pages.
Chinese Certificate of Patent dated Apr. 2, 2014 for Chinese Application No. 201080011537.8; 4 pages.
Response to International Preliminary Report on Patenability dated Oct. 11, 2011 for European Application No. 10701269.2; 14 pages.
European Notice of Allowance dated Aug. 14, 2012 for European Application No. 10701269.2; 6 pages.
European Decision to Grant dated Nov. 15, 2012 for European Application No. 10701269.2; 2 pages.
English translation of Japanese Office Action dated May 13, 2013 for Japanese Application No. 2011-554057; 2 pages.
Instruction Letter for responding to Japanese Office Action dated May 13, 2013 for Japanese Application No. 2011-554057; 2 pages.
Response to Office Action with English claims dated Jul. 31, 2013 for Japanese Application No. 2011-554057; 5 pages.
Japanese Decision of Grant dated Oct. 30, 2013 for Japanese Application No. 2011-554057; 3 pages.
Korean Office Action with English translation dated Sep. 30, 2014 for Korean Application No. 10-2011-7023484; 6 pages.
Instruction Letter for responding to Korean Office Action dated Sep. 30, 2014 for Korean Application No. 10-2011-7023484; 2 pages.
Korean Response to Office Action dated Dec. 30, 2014 for Korean Application No. 10-2011-7023484; 14 pages.
Korean Notice of Allowance with English translation and allowed claims dated Apr. 20, 2015 for Korean Application No. 10-2011-7023484; 9 pages.
Korean Certificate of Patent dated Apr. 28, 2015 for Korean Application No. 10-2011-7023484; 24 pages.

* cited by examiner

METHODS AND APPARATUS FOR GENERATING A THRESHOLD SIGNAL IN A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors, and, more particularly, to magnetic field sensors and related techniques for generating a threshold signal in a magnetic field sensor.

BACKGROUND

As is known, magnetic field sensors are used in a variety of applications. One example application is in motion (e.g., rotation) detectors where a magnetic field sensor is used to detect motion of an object, such as a ferromagnetic object, for example, a gear or ring magnet. In motion detectors, the magnetic field associated with the object is typically detected by a magnetic field sensing element, such as a Hall effect element or a magnetoresistance element, which provides a signal (i.e., a magnetic field signal) proportional to a detected magnetic field.

Some motion detectors generate an output signal indicative of the speed of motion of the object. Other motion detectors generate an output signal indicative of a direction of motion of the object as well. One such motion detector is described in U.S. Pat. No. 8,624,588 entitled "Apparatus and Method for Providing an Output Signal Indicative of a Speed of Rotation and a Direction of Rotation as a Ferromagnetic Object," which is assigned to the assignee of the present disclosure and incorporated herein by reference in its entirety.

Motion detectors are widely used in automobile control systems, for example to detect motion of a target object (e.g., camshaft) and to provide information (e.g., an absolute angle of rotation of the target object as it rotates) to an engine control processor for ignition timing control, fuel management and other operations. With this information, the engine control processor can adjust the timing of firing of the ignition system, the timing of fuel injection by the fuel injection system and perform other operations.

In high precision applications such as automobiles, accuracy variations in the detected motion of a target object (e.g., resulting from irregularities in a sensed target profile of the target object) can be problematic. Engine ignition timing, for example, depends on consistent detection accuracy. Some magnetic field sensor integrated circuits (ICs) contain circuitry and methods to mitigate the effects of irregularities resulting from mechanical variations such as rotational wobble or changes in an air gap between the IC and the target object.

SUMMARY

The present disclosure provides a magnetic field sensor and associated methods capable of generating a threshold signal in the magnetic field sensor. The described circuitry and methods can mitigate effects of electrical delays in the magnetic field sensor and improve detection accuracy of the magnetic field sensor.

In one aspect, a magnetic field sensor for detecting motion of an object includes one or more magnetic field sensing elements configured to generate a magnetic field signal in response to a magnetic field associated with the object. The magnetic field sensor additionally includes a motion detector responsive to the magnetic field signal and to a threshold signal and configured to generate a detector output signal having edges occurring in response to a comparison of the magnetic field signal and the threshold signal. A speed detector responsive to the detector output signal generates a speed signal indicative of a speed of motion of the object. A threshold generator responsive to the speed signal generates the threshold signal having a level that varies in response to the speed signal.

The magnetic field sensor may include one or more of the following features. The threshold signal may be at a first signal level when the speed signal indicates a speed of motion of the object greater than a predetermined speed. The threshold signal may be at a second signal level when the speed signal indicates a speed of motion of the object less than the predetermined speed. The speed detector may include a counter responsive to the detector output signal and configured to generate a count signal having a value corresponding to a duration between like edges of the detector output signal. The speed detector may further include a filter responsive to the count signal and configured to generate the speed signal. The speed signal may be generated as an average of a predetermined number of count signal values. The predetermined number of count signal values may correspond to a number of features of the object. The threshold generator may include a memory device. The memory device may be configured to store a plurality of threshold adjustment amounts according to at least the speed of motion of the object. The threshold generator may further include a summing circuit responsive to at least a stored threshold adjustment amount and configured to generate the threshold signal.

The object may be comprised of a magnetic material and the magnetic field may be generated by the object. The object may be comprised of a ferromagnetic material and the magnetic field may be affected by movement of the object. The magnetic field sensor may include a magnet and the magnetic field may be generated by the magnet. The magnetic field sensing elements may be Hall effect elements and/or magnetoresistance elements, such as an anisotropic magnetoresistance (AMR) element, a giant magnetoresistance (GMR) element, a tunneling magnetoresistance (TMR) element, a magnetic tunnel junction (MTJ) element, or a spin valve element.

The motion detector may include a tracking circuit responsive to the magnetic field signal and configured to track peaks of the magnetic field signal and generate a tracking signal. The threshold generator may be further responsive to the tracking signal to generate the threshold signal. The detector output signal may transition when a difference between one or more tracked peaks of the magnetic field signal and the threshold signal exceeds a predetermined amount. The tracking signal may track positive and negative peaks of the magnetic field signal. The threshold signal may he provided as a predetermined percentage of a peak-to-peak value of the tracking signal. The threshold generator may be further responsive to a fixed threshold voltage to generate the threshold signal.

In another aspect, a method for generating a threshold signal in a magnetic field sensor for detecting motion of an object includes receiving a magnetic field signal generated in response to a magnetic field associated with an object and generating a detector output signal in response to the magnetic field signal and a threshold signal, the detector output signal having edges occurring in response to a comparison of the magnetic field signal and the threshold signal. The method additionally includes generating a speed signal indicative of a speed of motion of the object in response to the detector output signal and generating the threshold signal in response to the speed signal, the threshold signal having a level that varies in response to the speed signal.

Features of the method may include one or more of the following. Generating the speed signal may include generating a count signal having a value corresponding to a duration between like edges of the detector output signal. Generating the speed signal may include storing a plurality of threshold adjustment amounts associated with a speed of motion of the object. Generating the threshold signal may include generating the threshold signal in response to a stored threshold adjustment amount. Generating the threshold signal may include tracking peaks of the magnetic field signal, generating a tracking signal in response to the tracked peaks, and generating the threshold signal in response to the stored threshold adjustment amount and farther in response to the tracking signal. Generating the threshold signal may include generating the threshold signal in response to the stored threshold adjustment amount and further in response to a fixed threshold voltage. Generating the threshold signal in response to the speed signal may include generating a threshold signal having a first signal level when the speed signal indicates a speed of motion of the object greater than a predetermined speed and generating a threshold signal having a second signal level when the speed signal indicates a speed of motion of the object less than the predetermined speed.

In yet another aspect, a magnetic field sensor for detecting motion of an object includes one or more magnetic field sensing elements configured to generate a magnetic field signal in response to a magnetic field associated with the object. The magnetic field sensor additionally includes means for generating a detector output signal having edges occurring in response to a comparison of the magnetic field signal and a threshold signal and means for generating a speed signal indicative of a speed of motion of the object in response to the detector output signal. The magnetic field sensor further includes means for varying a level of the threshold signal in response to the speed signal. The magnetic field sensing elements may be Hall effect elements and/or magnetoresistance elements, such as an anisotropic magnetoresistance (AMR) element, a giant magnetoresistance (GMR) element, a tunneling magnetoresistance (TMR) element, a magnetic tunnel junction (MTJ) element, or a spin valve element.

BRIEF DESCRIPTION OF THE DRAWINGS

The foregoing features of the disclosure, as well as the disclosure itself may be more carefully understood from the following detailed description of the drawings, which.

DETAILED DESCRIPTION

Figure 1:
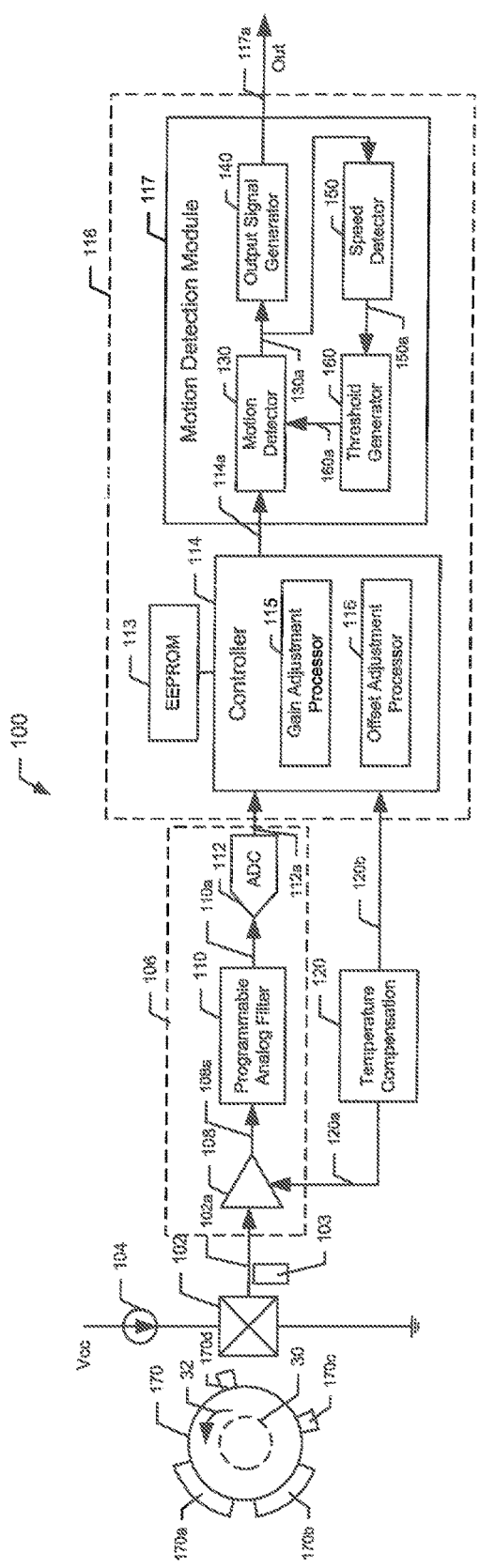
FIG. 1 is a block diagram of an example magnetic field sensor for detecting motion of an object, the magnetic field sensor shown proximate to an example object.

The features and other details of the disclosure will now be more particularly described. It will be understood that any specific embodiments described herein are shown by way of illustration and not as limitations of the concepts, systems and techniques described herein. The principal features of this disclosure can be employed in various embodiments without departing from the scope of the concepts sought to be protected.

For convenience, certain introductory concepts and terms used in the specification are collected here.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied, for example, in a specially programmed microprocessor, a digital signal processor (DSP), or an application specific integrated circuit (ASIC) which can be an analog ASIC or a digital ASIC. Additionally, in some embodiments the "processor" can be embodied in configurable hardware such as field programmable gate arrays (FPGAs) or programmable logic arrays (PLAs). In some embodiments, the "processor" can also he embodied in a microprocessor with associated program memory. Furthermore, in some embodiments the "processor" can be embodied in a discrete electronic circuit, which can be an analog circuit, a digital circuit or a combination of an analog circuit and a digital circuit. The "controller" described herein may be provided as a "processor."

As used herein, the term "motion" is used to describe a variety of types of movement associated with an object, for example, including rotational movement (or "rotation") and linear (or "rectilinear") movement of the object. A "motion detector" may, for example, detect rotation of an object. A "rotation detector" is a particular type of "motion detector."

While magnetic field sensors including a single magnetic field sensing element are described in several examples below, a single magnetic field sensing element is discussed to promote simplicity, clarity and understanding in the description of the concepts, systems, circuits and techniques sought to be protected herein and is not intended to be, and should not be construed as, limiting. The concepts, circuits and techniques disclosed herein may, of course, be implemented using more than a single magnetic field sensing element.

Referring now to FIG. 1, a magnetic field sensor 100 capable of detecting motion (e.g., speed of motion and/or direction of motion) of an object having features, e.g., gear teeth 170a, 170b, 170c, 170d of a ferromagnetic gear 170 (hereinafter "object 170"), is shown. The object 170 can be disposed, for example, upon a shaft 30 configured to rotate in a direction 32.

The magnetic field sensor 100 includes one or more magnetic field sensing elements, as indicated by magnetic field sensing element 102 in the example embodiment shown. The magnetic field sensing element 102 is driven by a current source 104 and configured to generate a magnetic field signal 102a in response to a magnetic field associated with the object 170 as may be generated, for example, by a magnet 103 disposed proximate to or within the magnetic field sensor 100. Motion of the object 170 can result in variations of the magnetic field sensed by the magnetic field sensing element 102 and, thus, result in variations of the magnetic field signal 102a generated by the magnetic field sensing element 102.

Although the magnetic field sensing element 102 is depicted as a Hall effect element, in some embodiments the magnetic field sensing element 102 is, for example, provided as a magnetoresistance element where the magnetoresistance element may be an anisotropic magnetoresistance (AMR) element, a giant magnetoresistance (GMR) element, a tunneling magnetoresistance (TMR) element, a magnetic tunnel junction (MTJ) element, or a spin valve element. It should be appreciated that the magnetic field sensing element 102 (which may comprise more than one magnetic field sensing element in some embodiments) may take any form suitable for detecting motion of the object 170 by sensing a magnetic field affected by such motion.

The object 170 may be a ferromagnetic object. The ferromagnetic object can be a magnetic object and the magnetic field detected by the magnetic field sensing element 102 may be generated by the object 170 itself and may vary depending on positions of the object 170 relative to the magnetic field sensor 100.

Furthermore, although the object 170 is shown in the form of a ferromagnetic gear in the example embodiment, the object 170 may take other forms. For example, the object 170 may take the form of a ring magnet having magnetic domains that are detected by the magnetic field sensor 100. Additionally, the object 170 may be coupled to an automobile wheel, steering shaft, or a camshaft, as a few examples.

The magnetic field sensor 100 includes a temperature compensation circuit 120 (e.g., to compensate for temperature induced changes in sensitivity of the magnetic field sensing element 102, and therefore, a magnitude of the magnetic field signal 102a), which circuit is preferably disposed on the same substrate as other circuitry of the magnetic field sensor 100. The temperature compensation circuit 120 is configured to generate temperature compensation signals 120a, 120b indicative of a temperature experienced by the magnetic field sensing element 102 as may be sensed by a temperature sensor, for example, which may be provided as part of the temperature compensation circuit 120 and disposed proximate to the magnetic field sensing element 102. One such temperature compensation circuit is described in co-pending U.S. patent application Ser. No. 13/833,847 entitled "Magnetic Field Sensor and Associated Method That Can Store a Measured Threshold Value in a Memory Device During a Time When The Magnetic Field Sensor is Powered Off," which is assigned to the assignee of the present disclosure and incorporated herein by reference in its entirety.

The magnetic field sensor 100 additionally includes a signal path 106 (e.g., an analog, digital or mixed signal path) coupled to receive the magnetic field signal 102a and configured to generate a signal (e.g., digital signal 112a) representative of the magnetic field signal 102a. The signal path includes an amplifier 108, a filter 110 and an analog-to-digital converter (ADC) 112 in the example embodiment shown, as will be explained.

The amplifier 108 is coupled to receive the magnetic field signal 102a generated by the magnetic field sensing element 102 and temperature compensation signal 120a and configured to generate a temperature adjusted signal 108a. The filter 110, which can be a programmable analog filter, for example, is coupled to receive the temperature adjusted signal 108a and configured to generate a filtered signal 110a. The ADC 112 is coupled to receive the filtered signal 110a and configured to generate a corresponding digital signal 112a.

The magnetic field sensor 100 further includes motion detection circuitry 118 including a memory device 113 (e.g., EEPROM), a controller 114 and a motion detection module 117. The controller 114 is coupled to receive the digital signal 112a and the temperature signal 120b, which can be the same as or similar to temperature signal 120a, and configured to generate a controller output signal 114a having gain and/or offset correction. The controller 114, which can be a synchronous digital controller or an analog controller, for example, includes a gain adjustment processor 115 and an offset adjustment processor 116 in the example embodiment shown. The gain adjustment processor 115 and the offset adjustment processor 116 can be coupled to receive stored gain correction coefficients and stored offset correction coefficients, respectively, from a memory device 113 (e.g., EEPROM), with the controller output signal 114a generated accordingly.

The memory device 113 is configured to store one or more gain correction coefficients and one or more offset correction coefficients, e.g., at the time of manufacture of the magnetic field sensor 100, or at any time thereafter. It will be appreciated that the one or more gain correction coefficients and the one or more offset correction coefficients may be established in a variety of manners, such as those described in U.S. Pat. No. 8,350,563 entitled "Magnetic field sensor and method used in a magnetic field sensor that adjusts a sensitivity and/or an offset over temperature" which is assigned to the assignee of the present disclosure and incorporated herein by reference in its entirety.

The motion detection module 117 is coupled to receive the controller output signal 114a and configured to generate a motion detection output signal 117a indicative of one or more of a speed of motion of the object 170 or a direction of motion of the object 170. The motion detection module 117 includes a motion detector 130 responsive to the controller output signal 114a (i.e., a magnetic field signal) and to a threshold signal 160a and configured to generate a detector output signal 130a having edges occurring in response to a comparison of the controller output signal 114a and the threshold signal 160a. The motion detection module 117 also includes a speed detector 150 responsive to the detector output signal 130a to generate a speed signal 150a indicative of a speed of motion of the object 170. The motion detection module 117 additionally includes a threshold generator 160 responsive to the speed signal 150a to generate the threshold signal 160a having a level (i.e., a signal level) that varies in response to the speed signal 150a. The motion detection module 117 may further include an output signal generator 140 responsive to the detector output signal 130a to generate the motion detection output signal 117a.

The edges of the detector output signal 130a coincide with locations (i,e, switchpoints) on the target object 170. The edge locations on the target object 170 may, for example, correspond to mechanical or magnetic target features such as tooth edges, tooth centers, notch centers, pole boundaries, or pole maxima. Ideally, each output signal edge accurately coincides with a respective target location; however, mechanical variations (such as varying air gap and target irregularities) can adversely affect edge accuracy. Additionally, electrical delay through the magnetic field sensor 100 can adversely affect edge accuracy. According to the disclosure, the threshold signal 160a is adjusted in order to minimize such inaccuracies by maintaining a constant switchpoint over speed.

While the magnetic field sensor 100 may be provided in the illustrated form of an integrated circuit with an analog front end portion and a digital portion, it will be appreciated that the particular delineation of which circuit functions are implemented in an analog fashion or with digital circuitry and signals can be varied. Further, some of the illustrated circuit functions can be implemented on an integrated circuit sensor 100 and other circuitry and functionality can be implemented on separate circuits (e.g., additional substrates within the same integrated circuit package, or additional integrated circuit packages, and/or on circuit boards).

In some embodiments, one or more portions of the motion detection module 117 (e.g., motion detector 130, output signal generator 140, speed detector 150, threshold generator 160) may be provided as part of the controller 114 and, thus, motion detection circuitry 118 is shown in phantom. Additionally, in some embodiments, the controller 114 can perform the function, operation, or sequence of operations of one or more portions of the motion detection module 117. Moreover, in some embodiments, the memory device 113 is provided as part of the controller 114 and/or the motion detection module 117 (e.g., as onboard EEPROM).

Figure 2:
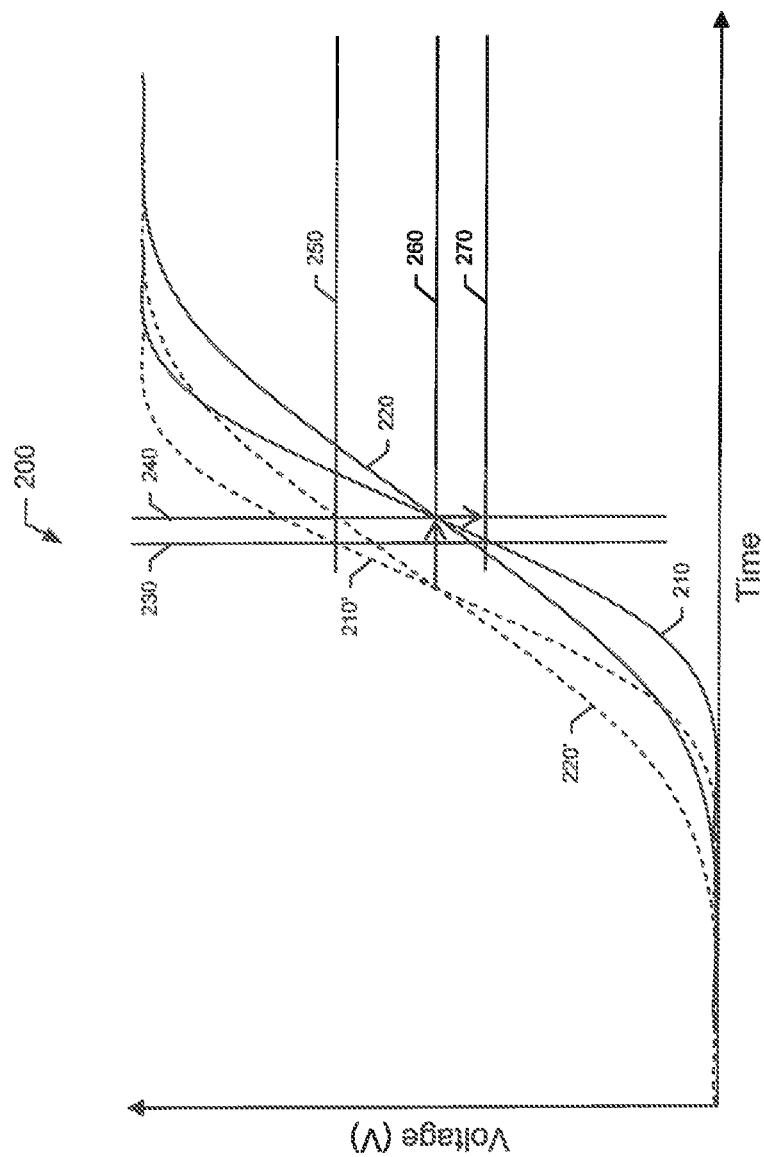
FIG. 2 shows illustrative signal waveforms as may be generated by the magnetic field sensor of FIG. 1.

Referring to FIG. 2, illustrative signal waveforms as may be generated by a magnetic field sensor, which can be the same as or similar to magnetic field sensor 100 shown in FIG. 1, are shown in a plot 200 having a horizontal axis with a scale in time units and a vertical axis with a scale in voltage units of volts (V). The plot 200 includes signals 210' and 220' representative of the magnetic field when an object (e.g., 170, shown in FIG. 1) detected by the magnetic field sensor is moving at a first speed and a second, lower speed, respectively. The plot 200 also includes signals 210 and 220 representative of example magnetic field signals (e.g., 110a, shown in FIG. 1) as may be generated by the magnetic field sensor when an object (e.g., 170, shown in FIG. 1) detected by the magnetic field sensor is moving at the first speed and the second, lower speed, respectively, and the magnetic field sensor introduces an electrical delay, as discussed above. The plot 200 additionally includes lines 250, 260 and 270 representative of various threshold signals of the magnetic field sensor (e.g., showing the switchpoint(s) of the magnetic field sensor in terms of a voltage level). The plot 200 further includes lines 230 and 240 representative of the switchpoint(s) of the magnetic field sensor in terms of position of the object (e.g., 170, shown in FIG. 1).

As illustrated, the slope of the signals 210, 220, 210' and 220' varies in response to the speed of the object (e.g., 170, shown in FIG. 1). As is also illustrated, as a result of the electrical delay of the magnetic field sensor, an output signal generated by the motion detector (e.g., 130, shown in FIG. 1) in response to receiving the signals 210, 220 will be delayed with respect to the actual magnetic field. Such may, for example, result in a decrease in detection accuracy by the magnetic field sensor.

In accordance with the concepts, systems, circuits and techniques described herein, by generating a threshold signal 160a having a level that varies in response to a speed signal 150a indicative of a speed of motion of the object (and thereby adjusting the switchpoint(s) of the magnetic field, sensor accordingly), detection accuracy is increased.

Figure 3:
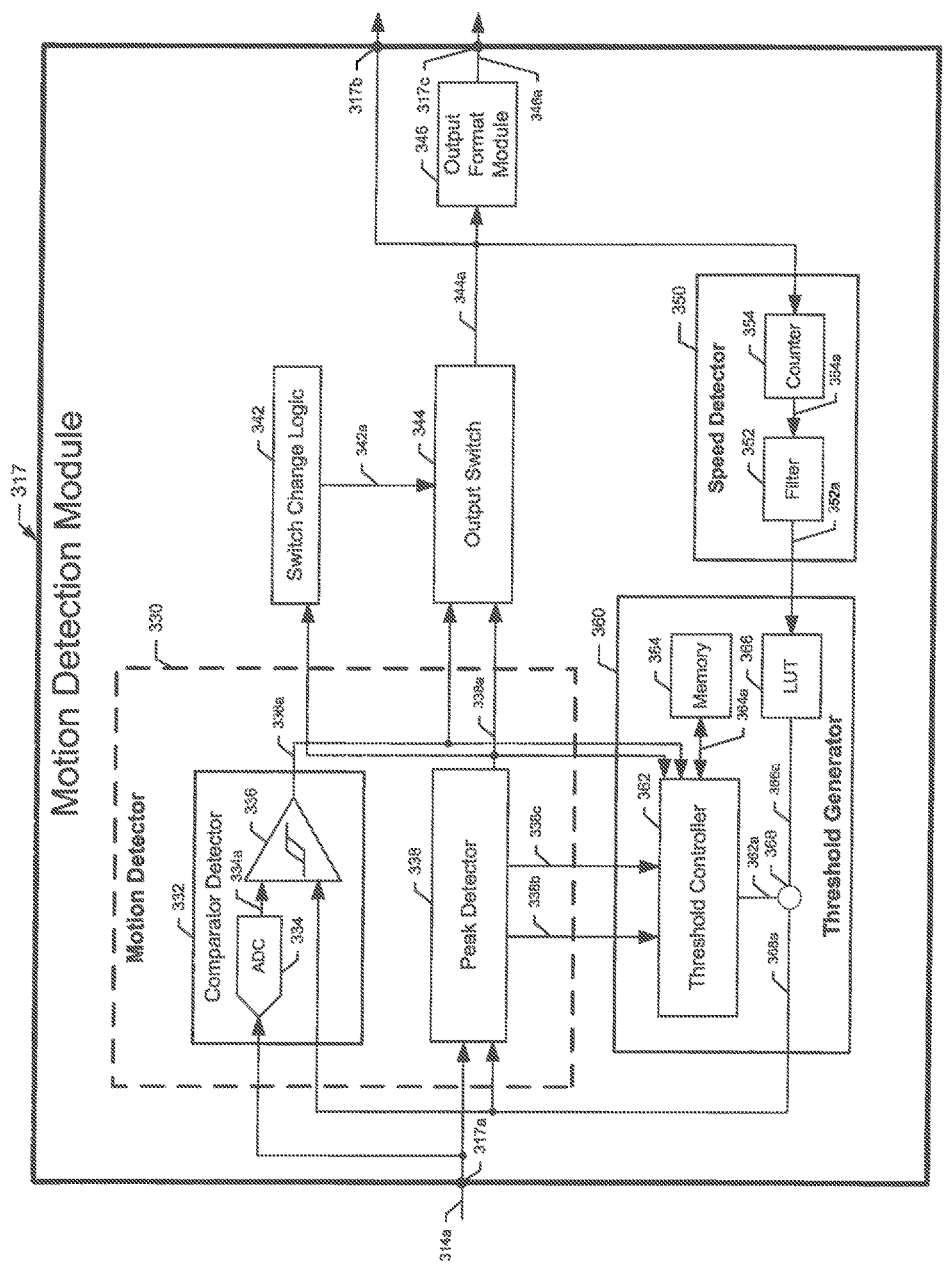
FIG. 3 is a block diagram of an example motion detection module of the magnetic field sensor of FIG. 1.

Referring to FIG. 3, a motion detection module 317, which can be the same as or similar to the motion detection module 117 (FIG. 1), is coupled to receive a signal 314a (also referred to herein as a "magnetic field signal," which can be the same as or similar to the controller output signal 114a (FIG. 1)) at an input terminal 317a. The motion detection module 317 includes a motion detector 330 having a first input coupled to the input terminal 317a and a second input coupled to the output of a threshold generator 360. The motion detector 330 receives the magnetic field signal 314a and a threshold signal 368a generated by the threshold generator 360 and is configured to generate a detector output signal (e.g. 336a) having edges occurring in response to a comparison of the signal 314a and the threshold signal 368a.

The motion detector 330 includes one or more detectors, for example, a comparator detector 332 and a peak detector 338, as shown, each coupled to receive the magnetic field signal 314a and the threshold signal 368a and to provide a respective output signal 336a, 338a having edges indicative of motion of the object (i.e., a target object).

The comparator detector 332 includes an ADC 334 and a comparator 336, the ADC 334 coupled to receive the signal 314a and the comparator 336 coupled to receive the threshold signal 368a and a signal 334a from the output of the ADC 334. In some embodiments, however, the ADC 334 is optional (e.g., when signal 314a is a digital signal), in which case the comparator 336 is coupled to received the signal 314a. Additionally, in some embodiments, the ADC 334 may be replaced with a digital-to-analog converter (DAC) (e.g., when the comparator 336 is an analog comparator and the signal 314a is a digital signal). The comparator 336 receives the threshold signal 368a and the signal 334a (or signal 114a) and generates a comparator detector output signal 336a having edges occurring in response to a comparison of the signal 334a (or signal 114a) and a comparator threshold as may be set by the threshold signal 368a.

Depending upon the arrangement of magnetic field sensing element(s) (e.g., 102, shown in FIG. 1) in the magnetic field sensor (e.g., 100, shown in FIG. 1), the comparator detector 332 can be operable as a tooth detector (e.g., a true power on state (TPOS) detector) or as an edge detector. As one example where the magnetic field sensor includes a single magnetic field sensing element 102 as shown above in conjunction with FIG. 1, the comparator detector 332 is operable as a tooth detector (as opposed to an edge detector), and therefore, provides a TPOS function, able to distinguish a tooth in the object 170 (FIG. 1) from a valley, even before any motion of object 170. In contrast, the comparator detector 332 may be operable as an edge detector when the magnetic field sensor (e.g., 100, shown in FIG. 1) includes more than one magnetic field sensing element arranged in a differential arrangement.

The peak detector 338 is configured to track positive and negative peaks of the magnetic field signal 114a and generate a peak detector output signal 338a at a first output in response to the signal 314a crossing a threshold signal 368a that is based on the detected peaks. To this end, the peak detector 338 may include one or more DACs to generate positive and negative peak signals 338b, 338c (sometimes referred to as an NDAC and PDAC signal, respectively), at second and third outputs, respectively, which signals are indicative of magnitudes of positive peaks and negative peaks of the signal 314a and may also be representative of a tracking signal.

The peak detector 338 may take various forms, for example, peak detector 338 may take the form of a peak-to-peak percentage detector in which the threshold signal 368a is a percentage of the peak-to-peak value of the tracking signal (i.e., a percentage of the peak-to-peak difference between the positive tracking signal 338b and the negative tracking signal 338c). One such peak-to-peak percentage detector is described in U.S. Pat. No. 5,917,320 entitled "Detection of Passing Magnetic Articles While Periodically Adapting Detection Threshold," which is assigned to the assignee of the present disclosure and incorporated herein by reference in its entirety.

In an alternative embodiment, the peak detector 338 may take the form of a so-called slope-activated or peak-referenced detector in which the threshold signal 368a differs from the positive and/or negative peaks (i.e., the peaks and valleys) of the magnetic field signal 314a by a predetermined amount. Thus, in this type of detector, the peak detector output signal 338a changes state when the magnetic field signal 314a departs from a peak and/or valley (as provided by the positive and negative tracking signals 338b, 338c) by the predetermined amount. One such slope-activated detector is described in U.S. Pat. No. 6,091,239 entitled "Detection of Passing Magnetic Articles with a Peak Referenced Threshold Detector," which is assigned to the assignee of the present disclosure and incorporated herein by reference in its entirety.

The motion detection module 317 also includes switch change logic 342, an output switch 344 and an output format module 346, one or more of which may be provided as part of to the motion detector 330 or an output signal generator, similar to the output signal generator 140 of FIG. 1. The switch change logic 342 has an input coupled to the peak detector output and the output switch 344 has a first input coupled to the switch change logic output, a second input coupled to the comparator detector output, and a third input coupled to the peak detector output. By way of a control signal 342a generated by a switch change logic module 342, the output switch 344 provides a detector output signal 344a representative of a selected one of the comparator detector output signal 336a or the peak detector output signal 338a at a first output terminal 317b of the motion detection module 317. In one embodiment, the output switch 344 selects the comparator detector output signal 336a to provide the detector output signal 344a at power on and the switch change logic 342 causes the output switch 344 to select the peak detector output signal 338a as the detector output signal after a predetermined number of edges of the peak detector output signal have been detected. It will be appreciated by those of ordinary skill in the art that other schemes are possible for selecting which output signal 336a, 338a provides the detector output signal 344a.

The detector output signal 344a, which can be the same as or similar to the output signal. 117a of FIG. 1 or output signal 130a of FIG. 1, can be a two state output signal for which a high state is indicative of one of the teeth of the object 170 of FIG. 1 being proximate to the magnetic field sensing element 102 of FIG. 1, and for which a low state is indicative of one of the valleys of the object 170 being proximate to the magnetic field sensing element 102. However, in other embodiments, states of the motion detection output signal 344a can be reversed from those described above and/or can be representative of other features of the object 170. The detector output signal 344a can be indicative of the speed of motion of the object 170. In some embodiments, for example, the detector output signal 344a is a two state square-wave signal with edges occurring at a frequency proportional to the speed of motion of the object 170

In some embodiments, the motion detection module 317 can include an output format module 346 coupled to receive the detector output signal 344a and configured to provide a sensor output signal 346a at a second output terminal 317c of the motion detection module 317. The output format module 346 may provide the sensor output signal 346a in various forms and may encode additional information to provide the sensor output signal 346a. For example, in some embodiments, the sensor output signal 346a is indicative of the direction of motion of the object 170 and may he provided in the form of a two-state signal having a frequency proportional to the speed of motion of the object 170 and a duty cycle (or pulse width or on-time duration) representative of the direction of motion of the object 170. In other embodiments, the sensor output signal 346a is provided in the form of a digital word representative of the speed of motion of the object 170 and the direction of motion of the object 170. It will be appreciated however that various schemes are possible to communicate direction information in the sensor output signal 346a, such as those described in the above referenced U.S. Pat. No. 8,624,588. The sensor output signal 346a can be provided in a variety of formats, for example, a SENT format, a CAN format, or an I²C format. Other formats are also possible.

The motion detection module 317 additionally includes a speed detector 350 having an input adapted to couple to the motion detector output. The speed detector 350 further includes a filter 352 and a counter 354 (e.g., a pulse counter) in the example embodiment shown. The speed detector 350 is responsive to the detector output signal 344a, and to a clock signal (not shown) as may be generated by an oscillator coupled to an input of the speed detector 350, to generate a speed signal 352a indicative of a speed of motion of the object (e.g., object 170, shown in FIG. 1).

The counter 354, which can be a binary counter (e.g., an 8-bit binary counter) according to some embodiments, is responsive to the detector output signal 344a and the clock signal and configured to generate a count signal 354a having a value corresponding to a duration between like edges of the detector output signal 344a.

The filter 352 is responsive to the count signal 354a and configured to generate the speed signal 352a. In some embodiments, the speed signal 352a is generated as an average of a predetermined number of count signal values. The predetermined number of count signal values may, for example, correspond to a number of features (e.g., gear teeth) of the object (e.g., object 170, shown in FIG. 1).

The motion detection module 317 additionally includes a threshold generator 360 having a threshold controller 362, a memory device 364 (e.g., EEPROM), a look-up table (LUT) 366 and a threshold output module 368. The threshold generator 360 is coupled to receive the speed signal 352a, the positive peak signal 338b, the negative peak signal 338c, the peak detector output signal 338a and the comparator detector output signal 336a and is configured to generate the threshold signal 368a having a level that varies at least in response to the speed signal 352a.

The LUT 366, which may be provided as part of or separate from the memory device 364, is configured to store one or more parameters associated with the magnetic field sensor (e.g., 100, shown in FIG. 1), such as a plurality of threshold adjustment amounts according to at least the speed of motion of the object (e.g., 170, shown in FIG. 1). The threshold adjustment amounts may, for example, additionally be based on circuit delays and signal properties of the magnetic field sensor and/or the particular application in which the magnetic field sensor is being used (e.g., an automotive application) and may be used to adjust the level of a threshold controller signal 362a in order to generate the threshold signal 368a. In some embodiments, at least one of the threshold adjustment amounts is a predetermined value, as may be established during manufacture of the sensor and/or as may be user programmable. Alternatively or additionally at least one of the threshold adjustment amounts may be calculated during manufacture, during initialization (or power-on) of the magnetic field sensor, and/or during normal operation of the magnetic field sensor. In general, each threshold adjustment amount (referred to herein alternatively as threshold adjustment signal 366a) corresponds to a respective speed or range of speeds of motion of the object.

The LUT 366 is coupled to receive the speed signal 352a and configured to output a threshold adjustment signal 366a as a selected one of the stored threshold adjustment amounts. As one example, the LUT 366 can output the threshold adjustment signal 366a by retrieving a stored threshold adjustment amount from the LUT 366 corresponding to a signal level of the received speed signal 352a. In some embodiments, a computation in the threshold controller 362 or another suitable device may be performed to provide a threshold adjustment amount (rather than storing such threshold adjustment amounts in LUT 366). In one such embodiment, the speed signal 352a is received at an input of the threshold output module 368 which responds to the speed signal 352a to compute a corresponding threshold adjustment amount.

The threshold controller 362 is coupled to receive one or more of the positive and negative peak signals 338b, 338c generated by the peak detector 338, the peak detector output signal 338a, the comparator detector output signal 336a, and/or a stored threshold value 364a from the memory device 364, and is configured to generate the threshold controller signal 362a. The threshold controller 362 may also be coupled to receive a power on-off signal representative of a power on or as power off of the magnetic field sensor.

The threshold controller signal 362a represents the threshold signal for use by the selected detector (e.g., detector 332 or 338) without adjustment based on the speed signal 352a. As one example in which the threshold signal 368a is being provided to the peak detector 338 and the peak detector 338 is a peak-to-peak percentage detector, the threshold controller signal 362a can be a value representative of a predetermined percentage, for example, seventy percent, of a voltage difference between the positive and negative peak signals 338b, 338c at a particular point in time. As another example in which the threshold signal 368a is being provided to the peak detector 338 and the peak detector 338 is a peak-referenced detector, the threshold controller signal 362a can be a value representative of a predetermined offset from the positive peak signal 338b and/or the negative, peak signal 338c at a particular point in time. As another example in which the threshold signal 368a is being provided to the comparator detector 332, the threshold controller signal 362a can be a predetermined, fixed threshold value 364a stored in the memory device 364, such as may be preset (such as during manufacture) or user-programmable.

The memory device 364 (e.g., EEPROM) may additionally or alternatively store one or more threshold values 364a in the form of a threshold controller signal 362a generated by the threshold controller 362 and/or a threshold signal 368a, such as may be desirable for use upon a subsequent power up of the sensor. The threshold controller 362 may, for example, control the memory device 364 (or cause storage in the memory device 364) by way of a control line. Various schemes are possible for controlling when storage of a threshold value 364a occurs.

In one embodiment, the threshold controller 362 causes threshold value storage in the memory device 364 when the threshold controller signal 362a changes by a predetermined amount, which amount can be zero or more. In another embodiment, the threshold controller 362 causes storage when the threshold controller signal 362a differs from a predetermined stored threshold value by a predetermined amount, which amount can be zero or more. In another embodiment, the threshold controller 362 causes storage when the threshold controller 362 receives a signal (e.g., a power on/off signal) indicative of a power off condition of the magnetic field sensor (e.g., 100, shown in FIG. 1). In another embodiment, the threshold controller 362 causes storage when the comparator detector output signal 336a and/for the peak-detector output signal 338a has changed state a predetermined number of times after the magnetic field sensor has powered on. Storage operation by the threshold controller 362 in the memory device 364 can also have any combination of the above storage arrangements and/or arrangements described in the above-referenced copending U.S. patent application Ser. No. 13/833,847.

The threshold output module 368, which may include a summing circuit, for example, is coupled to receive the threshold controller signal 362a and the threshold adjustment signal 366a and configured to generate a threshold signal 368a as a combination of the threshold controller signal 362a and the threshold adjustment signal 366a. As one example, the threshold signal 368a is a summation of the threshold adjustment signal 366a and the threshold controller signal 362a when the speed signal 352a indicates a speed of motion of the object greater than a predetermined speed and the threshold signal 368a is equal to the threshold controller signal 362a when the speed signal 352a indicates a speed of motion of the object less than the predetermined speed. In this way, the threshold signal 368a is at a first signal level when the speed of motion of the object is greater than the predetermined speed and the threshold signal 368a is at a second signal level when the speed of motion is less than the predetermined speed. It should of come be appreciated that the threshold signal 368a may be adjusted to additional signal levels (e.g., a third signal level, a fourth signal level, etc.) in response to the speed of motion of the object being within different ranges of speeds.

Figure 4:
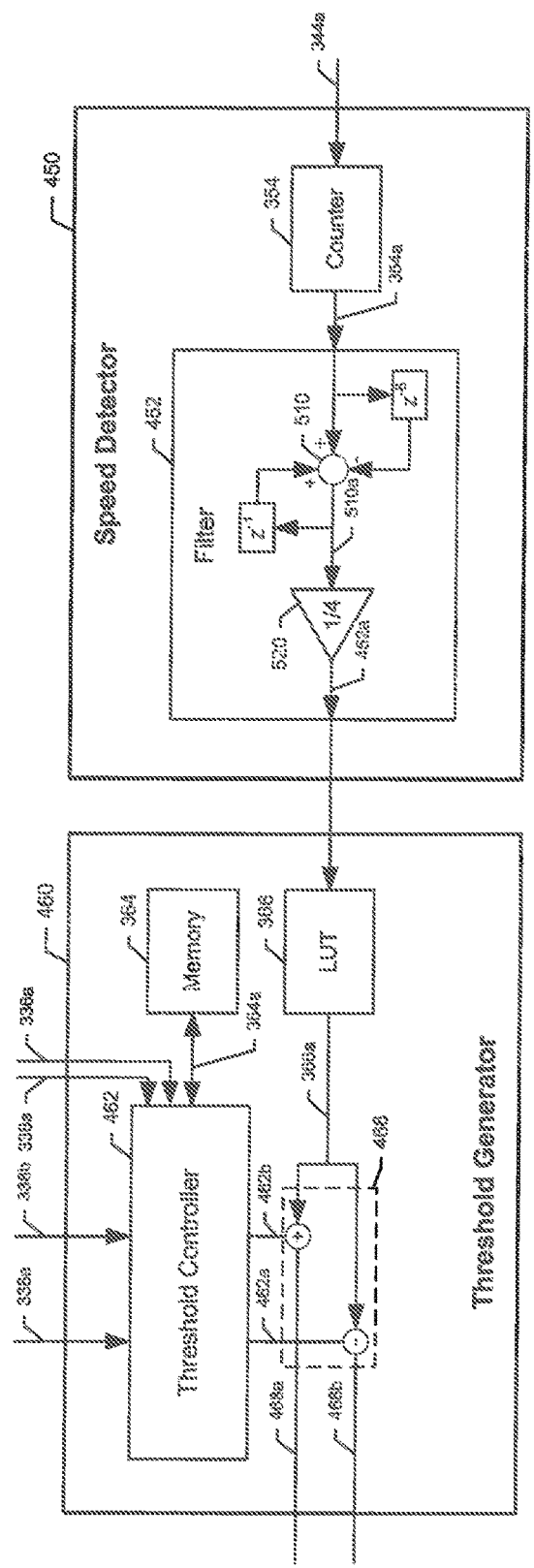
FIG. 4 is a block diagram of an example threshold generator and an example speed detector of the motion detection module of FIG. 3.

Referring to FIG. 4, in Which like elements of FIG. 3 are shown having like reference designations, a speed detector 450 similar to the speed detector 350 of FIG. 3 is shown. Additionally, a threshold generator 460 similar to the threshold generator 360 of FIG. 3 is shown. Here, however, the threshold generator 460 has a threshold output module 468 that is different than the threshold output module 368 of FIG. 3. Further, the threshold generator 460 has a threshold controller 462 that is substantially the same as threshold controller 362 of FIG. 3, but outputs a plurality of threshold controller signals (here, first and second threshold controller signals 462a, 462b) instead of a single threshold controller signal (threshold controller signal 362a).

The speed detector 450, which includes a counter 354 and a filter 452 in the example embodiment shown, can be coupled to receive the detector output signal 344a generated by the output switch 344 of FIG. 3, for example, at an input. The counter 354 is responsive to the detector output signal 344a and configured to generate a count signal 354a having a value corresponding to a duration between like edges of the detector output signal 344a.

The filter 452, which can be an analog filter or digital filter (e.g., a finite impulse response (FIR) filter) and can be the same as or similar to the filter 352 of FIG. 3, is coupled to receive the count signal 354a and configured to generate a speed signal 452a. In the example embodiment shown, the filter 452 includes a filter output module 510 and amplifier 520. The filter output module 510 is coupled to receive the count signal 354a and configured to generate a filter output signal 510a. The filtered output signal 510a may, for example, be calculated as an average of a number N samples (e.g., count signal values) of the count signal 354, with the number N corresponding to a number of features (e.g., gear teeth) of the object (e.g., 170, shown in FIG. 1). As one example, N may be eight, so that the speed signal 452a represents a running average of the previous eight count signal values.

The filter 452 additionally includes an amplifier 520. The amplifier 520 is coupled to receive the filtered output signal 510a and configured to generate an amplified signal 452a, which is provided as the speed signal (i.e., speed signal 452a) in the example embodiment shown. The amplifier 520 may, for example, apply a gain factor to the filtered output signal 510a.

The LUT 366 is coupled to receive the speed signal 452a (or the amplified signal 452a) and configured to output a threshold adjustment signal 366a as a selected one of the stored threshold adjustment amounts, as discussed above in conjunction with FIG. 3.

The threshold controller 462 is coupled to receive one or more of the positive and negative peak signals 338b, 338c, the peak detector output signal 338a, the comparator detector output signal 336a, and/or a predetermined fixed threshold value 364a from the memory device 364, and is configured to generate a plurality of threshold controller signals, here first and second threshold controller signals 462a and 462b. The threshold controller signals 462a, 462b may be provided for use by a peak detector (e.g., 338 of FIG. 3) in the form of a peak-to-peak percentage detector with each signal representing a different percentage of the peak-to-peak difference between the positive peak signal 338b and the negative peak signal 338c. Specifically, threshold controller signal 462a may have a nominal value on the order of 40% of the peak-to-peak difference and threshold controller signal 462b may have a nominal value on the order of 60% of the peak-to-peak difference. The threshold controller 462, similar to threshold controller 362 of FIG. 3, may also be coupled to receive a power on-off signal representative of a power on or a power off of the magnetic field sensor (e.g., 100, shown in FIG. 1).

The threshold output module 468, which may include one or more of a summing circuit and a subtractor circuit, for example, is coupled to receive the plurality of threshold controller signals 462a, 462b and the threshold adjustment signal 366a and configured to generate first and second threshold signals 468a, 468b as a combination of the threshold controller signals 462a, 462b and the threshold adjustment signal 366a. In the above-described example in which each of the threshold controller signals 462a, 462b represents a different percentage of the peak-to-peak difference between the positive and negative peak signals 336a, 338b, the threshold signal 468a may be provided by the sum of the threshold controller signal 462b and the threshold adjustment signal 366a (i.e., signal 468a may be less than 60% of the peak-to-peak signal difference by the level of the threshold adjustment signal 366a) and the threshold signal 468b may be provided by the difference between the threshold controller signal 462a and the threshold adjustment signal 366a (i.e., signal 468b may be greater than 40% of the peak-to-peak signal difference by the level of the threshold adjustment signal 366a).

Similar to threshold signal 368a, the first and second threshold signals 468a, 468b have levels that vary in response to at least the speed signal 452a. As one example, the first and second threshold signals 468a, 468b are each at a respective first signal level when the speed signal 452a indicates a speed of motion of the object (e.g., 170, shown in FIG. 1) greater than a predetermined speed and the first and second threshold signals 468a, 468b are each at a respective second signal level when the speed signal 452a indicates a speed of motion of the object (e.g., 170, shown in FIG. 1) less than the predetermined speed.

Figure 5:
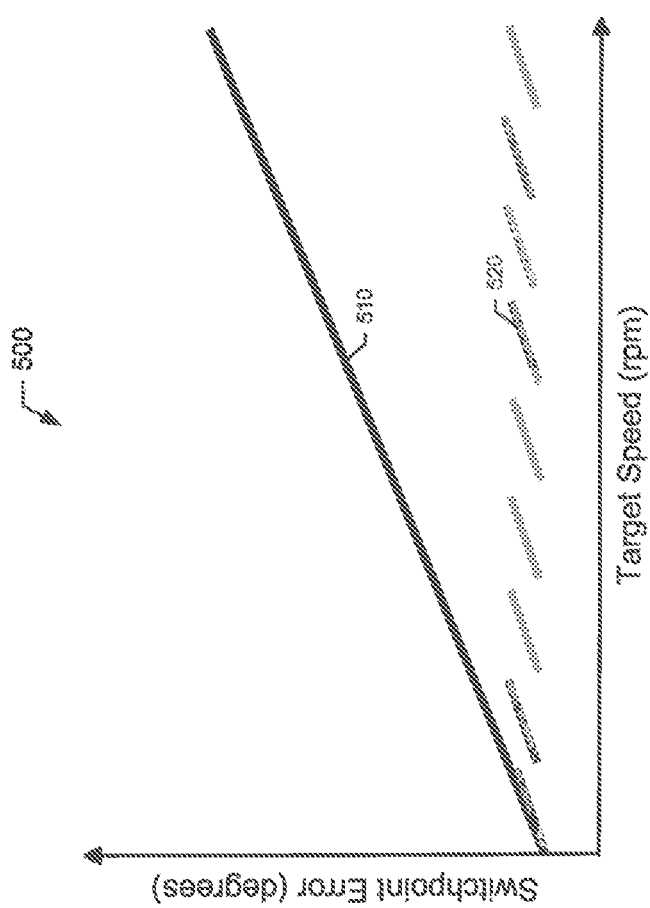
FIG. 5 shows an example switchpoint error response characteristic of a magnetic field sensor with switchpoint error correction and of a magnetic field sensor without switchpoint error correction.

Referring to FIG. 5, an example switchpoint error response characteristic is shown in a plot 500 having a horizontal axis with a scale in speed units of revolutions per minute (rpm) and a vertical axis with a scale in error units of degrees. The plot 500 includes signals 510 and 520 representative of cumulative switchpoint error of an example output signal (e.g., 344a, shown in FIG. 3) generated by an example magnetic field sensor (e.g., 100, shown in FIG. 1) in relation to a speed of motion of an object (e.g., 170, shown in FIG. 1) when the switchpoint of the magnetic field sensor is corrected (as illustrated by signal 520) by varying one or more threshold signals (e.g., 368a, shown in FIG. 3) in accordance with the concepts, systems, circuits and techniques described herein and when the switchpoint is not corrected (as illustrated by signal 510). As illustrated, without correction, the switchpoint error of the output signal increases in response to an increase in the speed of motion of the object. In contrast, with correction, the switchpoint error of the output signal remains substantially constant and is substantially reduced in comparison with the uncorrected output signal. The resolution of the error correction can be increased by decreasing the increments (i.e., time increments) of the counter 354 (FIG. 4) and/or by increasing the number of threshold adjustment values stored in the LUT 366 (FIG. 4).

As described above and will be appreciated by one of skill in the art, embodiments of the disclosure herein may be configured as a system, method, or combination thereof. Accordingly, embodiments of the present disclosure may be comprised of various means including hardware, software, firmware or any combination thereof. Furthermore, embodiments of the present disclosure may take the form of a computer program product on a computer-readable storage medium having computer readable program instructions (e.g., computer software) embodied in the storage medium. Any suitable non transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Additionally, elements of different embodiments described herein may be combined to form other embodiments not specifically set forth above.

It will be appreciated that while some embodiments are described in which the detected motion of an object is rotation, the circuits and techniques described herein are applicable to other types of motion of an object.

Accordingly, it is submitted that that scope of the patent should not be limited to the described embodiments bat rather should be limited only by the spirit and scope of the following claims.

What is claimed is:

1. A magnetic field sensor for detecting motion of an object, comprising:
   one or more magnetic field sensing elements configured to generate a magnetic field signal in response to a magnetic field associated with the object;
   a motion detector responsive to the magnetic field signal and to a threshold signal and configured to generate a detector output signal having edges occurring in response to a comparison of the magnetic field signal and the threshold signal and occurring at a rate corresponding to a speed of motion of the object;
   a speed detector responsive to the detector output signal to generate a speed signal having a value corresponding to a duration between edges of the detector output signal; and
   a threshold generator coupled to receive the speed signal from the speed detector and coupled to the motion detector and configured to generate the threshold signal comprising a threshold adjustment amount having a level related to the speed of motion of the object in response to the speed signal.

2. The magnetic field sensor of claim 1, wherein the threshold signal is at a first signal level when the speed signal indicates a speed of motion of the object greater than a predetermined speed and wherein the threshold signal is at a second signal level when the speed signal indicates a speed of motion of the object less than the predetermined speed.

3. The magnetic field sensor of claim 1, wherein the speed detector comprises a counter responsive to the detector output signal and configured to generate a count signal having a value corresponding to a duration between like edges of the detector output signal.

4. The magnetic field sensor of claim 3, wherein the speed detector further comprises a filter responsive to the count signal and configured to generate the speed signal.

5. The magnetic field sensor of claim 4, wherein the speed signal is generated as an average of a predetermined, number of count signal values and wherein the predetermined number of count signal values corresponds to a number of features of the object.

6. The magnetic field sensor of claim 1, wherein the threshold generator comprises a memory device.

7. The magnetic field sensor of claim 6, wherein the memory device is configured to store a plurality of threshold adjustment amounts corresponding to the speed of motion of the object.

8. The magnetic field sensor of claim 7, wherein the threshold generator further comprises a summing circuit responsive to at least a stored threshold adjustment amount and configured to generate the threshold signal.

9. The magnetic field sensor of claim 1, wherein the object is comprised of a magnetic material and wherein the magnetic field is generated by the object.

10. The magnetic field sensor of claim 1, wherein the object is comprised of a ferromagnetic material and wherein the magnetic field is affected by movement of the object.

11. The magnetic field sensor of claim 10, further comprising a magnet and wherein the magnetic field is generated by the magnet.

12. The magnetic field sensor of claim 1, wherein the one or more magnetic field sensing elements comprise at least one Hall effect element.

13. The magnetic field sensor of claim 1, wherein the one or more magnetic field sensing elements comprise at least one magnetoresistance element.

14. The magnetic field sensor of claim 13, wherein the at least one magnetoresistance element is an anisotropic magnetoresistance (AMR) element, a giant magnetoresistance (GMR) element, a tunneling magnetoresistance (TMR) element, a magnetic tunnel junction (MTJ) element, or a spin valve element.

15. The magnetic field sensor of claim 1, wherein the motion detector comprises a tracking circuit responsive to the magnetic field signal and configured to track peaks of the magnetic field signal and generate a tracking signal and wherein the threshold generator is further responsive to the tracking signal to generate the threshold signal.

16. The magnetic field sensor of claim 15, wherein the detector output signal transitions when a difference between one or more tracked peaks of the magnetic field signal and the threshold signal exceeds a predetermined amount.

17. The magnetic field sensor of claim 15, wherein the tracking signal tracks positive and negative peaks of the magnetic field signal and wherein the threshold signal is provided as a predetermined percentage of a peak-to-peak value of the tracking signal.

18. The magnetic field sensor of claim 1, wherein the threshold generator is further responsive to a fixed threshold voltage to generate the threshold signal.

19. The magnetic field sensor of claim 1, wherein the threshold generator comprises a threshold controlled configured to compute the threshold adjustment amount corresponding to a speed of motion of the object.

20. A method for generating a threshold signal in a magnetic field sensor for detecting motion of an object, comprising:
   receiving a magnetic field signal generated in response to a magnetic field associated with an object;
   generating a detector output signal in response to the magnetic field signal and a threshold signal, the detector output signal having edges occurring in response to a comparison of the magnetic field signal and the threshold signal and occurring at a rate corresponding to a speed of motion of the object;
   generating a speed signal indicative of a speed of motion of the object in response to the detector output signal, wherein the speed signal has a value corresponding to a duration between edges of the detector output signal; and
   generating the threshold signal in response to the speed signal, the threshold signal comprising a threshold adjustment amount having a level related to the speed of motion of the object.

21. The method of claim 20, wherein generating the speed signal comprises generating a count signal having a value corresponding to a duration between like edges of the detector output signal.

22. The method of claim 20, further comprising storing a plurality of threshold adjustment amounts corresponding to the speed of motion of the object.

23. The method of claim 22, wherein generating the threshold signal comprises generating the threshold signal in response to a stored threshold adjustment amount.

24. The method of claim 23, wherein generating the threshold signal comprises tracking peaks of the magnetic field signal, generating a tracking signal in response to the tracked peaks, and generating the threshold signal in response to the stored threshold adjustment amount and further in response to the tracking signal.

25. The method of claim 23, wherein generating the threshold signal comprises generating the threshold signal in response to the stored threshold adjustment amount and further in response to a fixed threshold voltage.

26. The method of claim 20, wherein generating the threshold signal in response to the speed signal comprises generating a threshold signal having a first signal level when the speed signal indicates a speed of motion of the object greater than a predetermined speed and generating a threshold signal having a second signal level when the speed signal indicates a speed of motion of the object less than the predetermined speed.

27. The method of claim 20, wherein generating the threshold signal comprises computing the threshold adjustment corresponding to the speed of motion of the object.

28. A magnetic field sensor for detecting motion of an object, comprising:
   one or more magnetic field sensing elements configured to generate a magnetic field signal in response to a magnetic field associated with the object;
   means for generating a detector output signal having edges occurring in response to a comparison of the magnetic field signal and a threshold signal and occurring at a rate corresponding to a speed of motion of the object;
   means for generating a speed signal indicative of a speed of motion of the object in response to the detector output signal, wherein the speed signal has a value corresponding to a duration between edges of the detector output signal; and
   means for generating the threshold signal in response to the speed signal, the threshold signal comprising a threshold adjustment amount having a level related to the speed of motion of the object.

29. The magnetic field sensor of claim 28, wherein the one or more magnetic field sensing elements comprise at least one Hall effect element.

30. The magnetic field sensor of claim 28, wherein the one or more magnetic field sensing elements comprise at least one magnetoresistance element.

31. The magnetic field sensor of claim 30, wherein the at least one magnetoresistance element is an anisotropic magnetoresistance (AMR) element, a giant magnetoresistance (GMR) element, a tunneling magnetoresistance (TMR) element, a magnetic tunnel junction (MTJ) element, or a spin valve element.

* * * * *

UNITED STATES PATENT AND TRADEMARK OFFICE
CERTIFICATE OF CORRECTION

PATENT NO. : 9,970,996 B2  
APPLICATION NO. : 14/600826  
DATED : May 15, 2018  
INVENTOR(S) : Devon Fernandez et al.

Page 1 of 1

It is certified that error appears in the above-identified patent and that said Letters Patent is hereby corrected as shown below:

In the Specification

Column 2, Line 64 delete "may he provided" and replace with --may be provided--.

Column 4, Line 44 delete "Hail effect" and replace with --Hall effect--.

Column 5, Line 12 delete "also he" and replace with --also be--.

Column 7, Line 39 delete "(i,e, switchpoints)" and replace with --(i.e., switchpoints)--.

Column 8, Line 44 delete "field, sensor" and replace with --field sensor--.

Column 10, Line 7 delete "of to the motion" and replace with --of the motion--.

Column 10, Line 31 delete "signal. 117a" and replace with --signal 117a--.

Column 10, Line 55 delete "may he" and replace with --may be--.

Column 12, Line 63 delete "and/for" and replace with --and/or--.

Column 13, Line 21 delete "of come be" and replace with --of course be--.

Column 14, Line 40 delete "336a, 338b" and replace with --338b, 338c--.

Column 15, Line 45 delete "bat" and replace with --but--.

Signed and Sealed this  
Ninth Day of October, 2018

Andrei Iancu  
*Director of the United States Patent and Trademark Office*